United States Patent
Kim

(10) Patent No.: US 11,296,715 B1
(45) Date of Patent: Apr. 5, 2022

(54) BUILT-IN HARMONIC PREDICTION METHOD FOR EMBEDDED SEGMENTED-DATA-CONVERTERS AND SYSTEM THEREOF

(71) Applicant: Industry-University Cooperation Foundation Hanyang University ERICA Campus, Gyeonggi-do (KR)

(72) Inventor: Byoungho Kim, Gyeonggi-do (KR)

(73) Assignee: Industry-University Cooperation Foundation Hanyang University ERICA Campus, Gyeonggi-do (KR)

( * ) Notice: Subject to any disclaimer, the term of this patent is extended or adjusted under 35 U.S.C. 154(b) by 0 days.

(21) Appl. No.: 17/158,932

(22) Filed: Jan. 26, 2021

(30) Foreign Application Priority Data

Oct. 29, 2020 (KR) .......................... 10-2020-0141685

(51) Int. Cl.
*H03M 1/00* (2006.01)
*H03M 1/10* (2006.01)
*H03M 1/66* (2006.01)
*H03M 1/12* (2006.01)

(52) U.S. Cl.
CPC ......... *H03M 1/108* (2013.01); *H03M 1/1205* (2013.01); *H03M 1/66* (2013.01)

(58) Field of Classification Search
CPC ...... H03M 1/108; H03M 1/1205; H03M 1/66; H03M 1/12
USPC ......................................... 341/126, 155, 144
See application file for complete search history.

(56) References Cited

U.S. PATENT DOCUMENTS

| | | | |
|---|---|---|---|
| 8,255,183 B1* | 8/2012 | Husted | H04B 17/0085 702/117 |
| 9,503,116 B2* | 11/2016 | Speir | H03M 1/121 |
| 9,525,428 B2* | 12/2016 | Devarajan | H03M 1/128 |
| 9,654,133 B2* | 5/2017 | Speir | H03M 1/128 |
| 10,340,934 B1* | 7/2019 | Rakuljic | H03M 1/1033 |
| 11,067,702 B2* | 7/2021 | Babitch | G01S 19/21 |
| 2016/0182073 A1* | 6/2016 | Speir | H03M 3/382 341/120 |

(Continued)

OTHER PUBLICATIONS

Kim, B., et al., "Built-in Harmonic Prediction Scheme for Embedded Segmented-Data-Converters," IEEE Access, Jan. 7, 2020, (8) 7851-7860.

*Primary Examiner* — Jean B Jeanglaude
(74) *Attorney, Agent, or Firm* — Christensen O'Connor Johnson Kindness PLLC

(57) ABSTRACT

The inventive concept relates to a method and system for cost-effectively predicting the dynamic nonlinearities of on-chip segmented digital-to-analog converter (DAC) and analog-to-digital-converter (ADC), by looping a DAC to an ADC, using a programmable-gain-amplifier (PGA) and an external load board. The method may include a first loopback step of supplying an output signal from a coarse DAC, to which a sinusoidal signal is supplied, to a coarse ADC and a fine ADC through an external load board, a second loopback step of supplying an output signal from a fine DAC, to which a sinusoidal signal is supplied, to the fine ADC and the coarse ADC through the load board, and a step of predicting dynamic nonlinearity of each of a DAC and an ADC by processing equations exhibiting dynamic nonlinearity of a sub-DAC and a sub-ADC, which are obtained in the first loopback step and the second loopback step.

16 Claims, 9 Drawing Sheets

(56) References Cited

U.S. PATENT DOCUMENTS

| | | | | |
|---|---|---|---|---|
| 2016/0182075 A1* | 6/2016 | Devarajan | ............ | H03M 1/128 |
| | | | | 341/120 |
| 2019/0190530 A1* | 6/2019 | Rakuljic | ............ | H03M 1/1033 |
| 2020/0292594 A1* | 9/2020 | Hsu | ......................... | H03M 1/60 |
| 2020/0408924 A1* | 12/2020 | Babitch | ................... | G01S 19/21 |

* cited by examiner

BUILT-IN HARMONIC PREDICTION METHOD FOR EMBEDDED SEGMENTED-DATA-CONVERTERS AND SYSTEM THEREOF

CROSS-REFERENCE TO RELATED APPLICATION

This application claims priority under 35 U.S.C. § 119 to Korean Patent Application No. 10-2020-0141685 filed on Oct. 29, 2020, in the Korean Intellectual Property Office, the disclosures of which are incorporated by reference herein in their entireties.

BACKGROUND

Embodiments of the inventive concept described herein relate to a built-in harmonic prediction method for embedded segmented-data-converters and a system thereof and more particularly, relate to a method and system for cost-effectively predicting the dynamic nonlinearities of on-chip segmented digital-to-analog converter (DAC) and analog-to-digital-converter (ADC), by looping a DAC to an ADC, using a programmable-gain-amplifier (PGA) and an external load board.

A system-on-chip (SoC) has increasingly integrated more diverse analog functionalities to meet consumers' demand, such as sensors, analog-to-digital converters (ADC), digital-to-analog converters (DAC), radio-frequency (RF) circuits, power amplifiers, and passives.

Accordingly, ever-increasing significance of analog and mixed-signal circuit testing has motivated the reduction of the cost of automated-test equipment (ATE) and the test-time, which are the primary causes of high test-cost issue of conventional production testing.

FIG. 1 shows a traditional loopback test and is considered as a promising self-test scheme using a test platform as shown in FIG. 1. This scheme does not require any change in an original design of a device-under-test (DUT), and simply needs an external loopback path.

Referring to FIG. 1, a test stimulus, which is generated from an on-chip digital core 130, is applied to a DUT A channel 110 and is looped back to a DUT B channel 120 through an external loopback path. The on-chip digital core 130 is then used to analyze the loopback responses, and to predict the performance combined from those two DUT channels as a single unit. However, when the two channels mutually mask their own faults (e.g., cancellation between gain errors 1.0 dB and 1.0 dB from each of the two channels), the predicted performance may be the misinterpreted results. This is called fault masking, and results in serious product yield loss.

SUMMARY

Embodiments of the inventive concepts provide a loopback-based self-test technique to cost-effectively predict dynamic nonlinearities of on-chip segmented DAC and ADC as two individual DUTs, based on an external loopback configuration with a load board employing two paths in parallel: a programmable-gain-amplifier (PGA) path and a bypass path.

Further, an object of the inventive concept is to resolve high cost issue of process testing of conventional segmented data converters by using a proposed loopback-based test platform without sacrificing test accuracy.

In addition, an object of the inventive concept is to resolve the fault-masking issue of conventional loopback testing by using loopback-based correlation models.

According to an exemplary embodiment, a built-in harmonic prediction method for embedded segmented data converters includes a first loopback step of supplying an output signal from a coarse DAC, to which a sinusoidal signal is supplied, to a coarse ADC and a fine ADC through an external load board, a second loopback step of supplying an output signal from a fine DAC, to which a sinusoidal signal is supplied, to the fine ADC and the coarse ADC through the load board, and a step of predicting dynamic nonlinearity of each of a DAC and an ADC by processing equations exhibiting dynamic nonlinearity of a sub-DAC and a sub-ADC, which are obtained in the first loopback step and the second loopback step.

The first loopback step may be characterized by supplying the sinusoidal signal to the coarse DAC and bypassing the fine DAC and may include supplying the output signal from the coarse DAC to the coarse ADC through a bypass path on the load board, and supplying the output signal from the coarse DAC to the input full-scale range of the fine ADC through a PGA path of the load board.

The second loopback step may be characterized by applying the sinusoidal signal to the fine DAC and bypassing the coarse DAC, and may include supplying the output signal from the fine DAC to the fine ADC through a bypass path on the load board, and supplying the output signal from the fine DAC to the input full-scale range of the coarse ADC through a PGA path of the load board.

The step of predicting the dynamic nonlinearity may include predicting nonlinearity caused by inter stage errors introduced by conducting a combination process of outputs from the sub-DAC or the sub-ADC.

The step of predicting the dynamic nonlinearity may include predicting the dynamic nonlinearity of each of the DAC and the ADC by processing six simultaneous equations obtained in the first loopback step and six simultaneous equations obtained in the second loopback step.

The step of predicting the dynamic nonlinearity may include obtaining twelve harmonic coefficients obtained from the DAC and the ADC by solving the twelve simultaneous equations in a post-processing process.

According to an exemplary embodiment, a built-in harmonic prediction system for embedded segmented data converters includes a first loopback test unit configured to supply an output signal from a coarse DAC, to which a sinusoidal signal is supplied, to a coarse ADC and a fine ADC through an external load board, a second loopback test unit configured to supply an output signal from a fine DAC, to which a sinusoidal signal is supplied, to the fine ADC and the coarse ADC through the load board, and a prediction unit configured to predict dynamic nonlinearity of each of a DAC and an ADC by processing equations exhibiting dynamic nonlinearity of a sub-DAC and a sub-ADC, which are obtained in the first loopback test unit and the second loopback test unit.

The first loopback test unit may be characterized by supplying the sinusoidal signal to the coarse DAC and bypassing the fine DAC and may supply the output signal from the coarse DAC to the coarse ADC through a bypass path of the load board, and supply the output signal from the coarse DAC to an input full-scale range of the fine ADC through a PGA path of the load board.

The second loopback test unit may be characterized by supplying the sinusoidal signal to the fine DAC, and bypassing the coarse DAC, and may supply the output signal from the fine DAC to the fine ADC through a bypass path on the load board, and supply the output signal from the fine DAC to the input full-scale range of the coarse ADC through a PGA path of the load board.

The prediction unit may predict nonlinearity caused by inter stage errors introduced by conducting a combination process of outputs from the sub-DAC or the sub-ADC.

The prediction unit may predict the dynamic nonlinearity of each of the DAC and the ADC by processing six simultaneous equations obtained in the first loopback test unit and six simultaneous equations obtained in the second loopback test unit.

The prediction unit may obtain twelve harmonic coefficients obtained from the DAC and the ADC by solving the twelve simultaneous equations in a post-processing process.

According to the embodiments of the inventive concept, it is possible to provide a loopback-based self-test technique to cost-effectively predict dynamic nonlinearities of on-chip segmented DAC and ADC as two individual DUTs, based on an external loopback configuration with a load board employing two paths in parallel: a programmable-gain-amplifier (PGA) path and a bypass path.

In addition, according to the embodiments of the inventive concept, it is possible to resolve high cost issue of process testing of conventional segmented data converters by using a proposed loopback-based test platform without sacrificing test accuracy, and resolve the fault-masking issue of conventional loopback testing by loopback-based correlation models.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
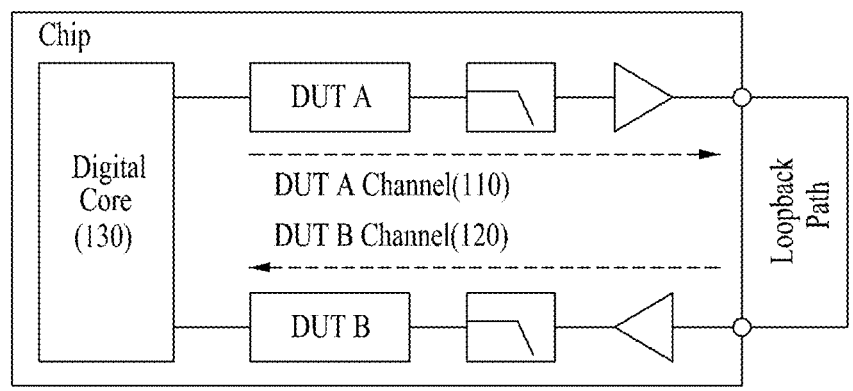
FIG. 1 is a diagram for describing a conventional loopback test platform.

Hereinafter, embodiments of the inventive concept will be described in detail with reference to the exemplary drawings. However, it will be understood that the inventive concept is by no means restricted or limited in any manner by these embodiments. In addition, the same reference numeral shown in each drawing indicates the same component.

In addition, terminologies used in the present specification are used to properly express preferred embodiments of the inventive concept, and may be changed depending on the intention of viewers or operators, or customs in the field to which the inventive concept belongs. Accordingly, definitions of these terminologies should be made based on the contents throughout the present specification.

Embodiments of the inventive concept may cost-effectively predict the dynamic nonlinearities of on-chip segmented digital-to-analog converter (DAC) and analog-to-digital-converter (ADC), by looping a DAC to an ADC, through an external load board employing two parallel paths: a programmable-gain-amplifier (PGA) path and a bypass path for test purpose.

The device-under-test (DUT) according to an embodiment of the inventive concept is characterized in that it is a self-test device, and may include a coarse DAC/ADC and a fine DAC/ADC. In this case, the coarse DAC/ADC may process the most significant bits (MSBs), the fine DAC/ADC may process the least significant bits (LSBs) of an input/output device, and their outputs may be added together so as to be an overall output.

Segmented data converters may include current-steering DAC, resistive DAC, subranging ADC, two-step ADC, and folding ADC and the like. Each advantage provided by diverse architectures used for each sub-DAC/ADC may make it possible to more easily meet the required specifications. In addition, the segmented DACs/ADCs may provide low glitch and small number of components (capacitors, resistors, and the like) i.e., small area, and thus, are commonly used in a SoC.

Hereinafter, embodiments of the inventive concept will be described in detail with reference to FIGS. 2 to 6.

Figure 2:
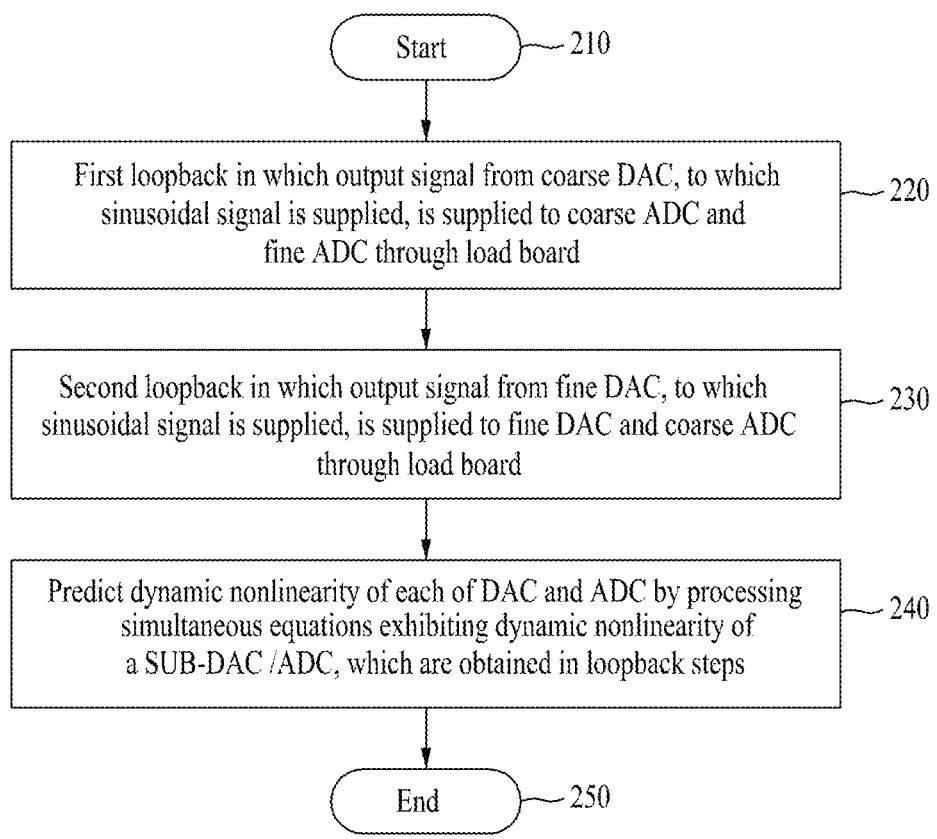
FIG. 2 illustrates a flowchart of operations of a built-in harmonic prediction method for an embedded segmented data converter according to an embodiment of the inventive concept.

FIG. 2 illustrates a flowchart of operations of a built-in harmonic prediction method for an embedded segmented data converter according to an embodiment of the inventive concept.

The segmented DAC (or ADC) may include coarse and fine DACs (or ADCs), and the built-in harmonic prediction method according to an embodiment of the inventive concept may sequentially perform two loopback tests.

Referring to FIG. 2, in the case of the first loopback test after start step 210, in step 220, an output signal from the coarse DAC to which a sinusoidal signal is supplied may be applied to the coarse ADC and the fine ADC through an external load board.

Specifically, step 220 is characterized by supplying the sinusoidal signal to the coarse DAC and bypassing the fine DAC. In step 220, the output signal from the coarse DAC may be supplied to the coarse ADC through a bypass path on the load board, and the output signal from the coarse DAC may be supplied to the input full-scale range of the fine ADC through a PGA path of the load board.

In the case of the second loopback test, in step 230, an output signal from the fine DAC, to which a sinusoidal signal is supplied, may be supplied to the fine ADC and the coarse ADC through the load board.

Specifically, step 230 is characterized by supplying the sinusoidal signal to the fine DAC, and bypassing the coarse DAC. In step 230, the output signal from the fine DAC may be supplied to the fine ADC through a bypass path on the load board, and the output signal from the fine DAC may be supplied to the input full-scale range of the coarse ADC through a PGA path of the load board.

In step 240, predict dynamic nonlinearity of each of a DAC and an ADC by processing the equations exhibiting dynamic nonlinearities of a sub-DAC and sub-ADC, which are obtained in the first loopback step and the second loopback step.

In step 240, the dynamic nonlinearity of each of the DAC and the ADC may be predicted by processing six simultaneous equations obtained in the first loopback step and six simultaneous equations obtained in the second loopback step. In step 240, in a post-processing process, twelve harmonic coefficients obtained from the DAC and ADC may be identified by solving the twelve simultaneous equations.

Accordingly, in step 240, it is possible to predict the dynamic nonlinearity of each of the DAC and the ADC by performing an output combination process of the sub-DAC or sub-ADC.

Thereafter, the built-in harmonic prediction method according to an embodiment of the inventive concept may perform an end operation 250.

Hereinafter, a built-in harmonic prediction process according to an embodiment of the inventive concept will be described in detail with reference to FIGS. 3 to 6.

Figure 3:
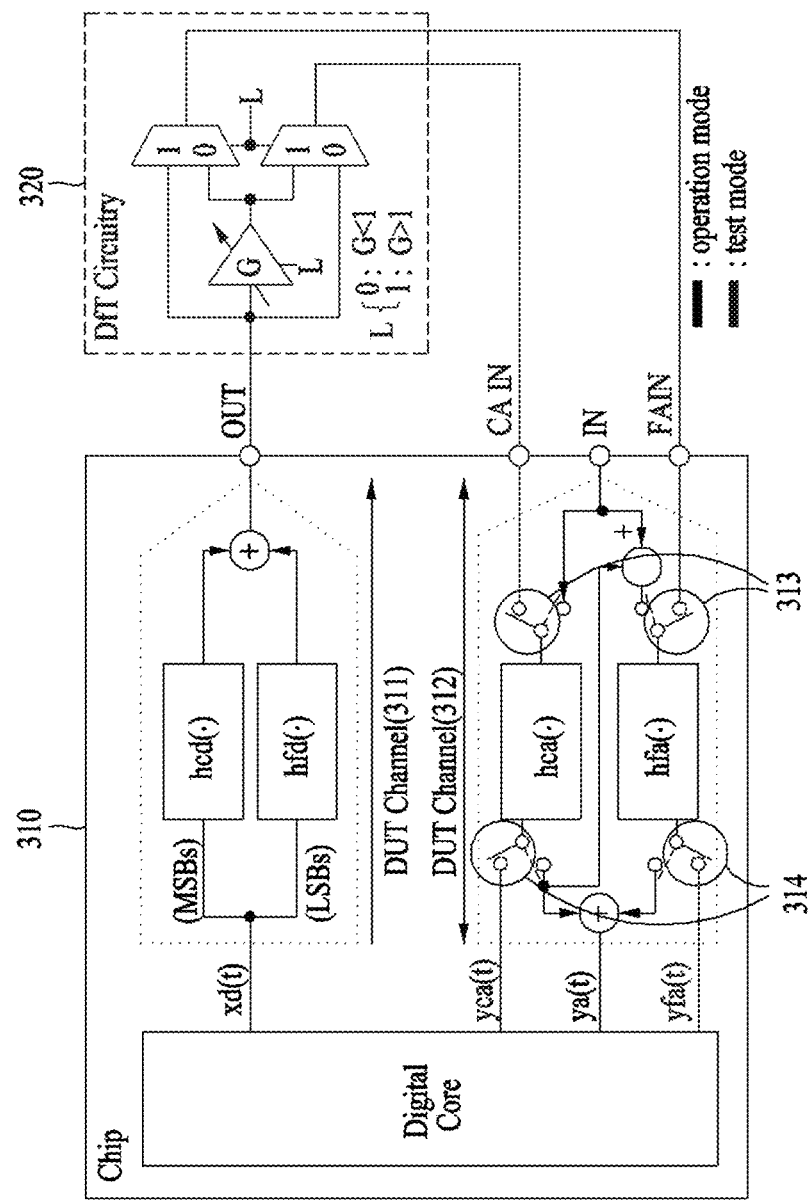
FIG. 3 illustrates a loopback configuration proposed for a load board or a PCB according to an embodiment of the inventive concept.
Figure 4A:
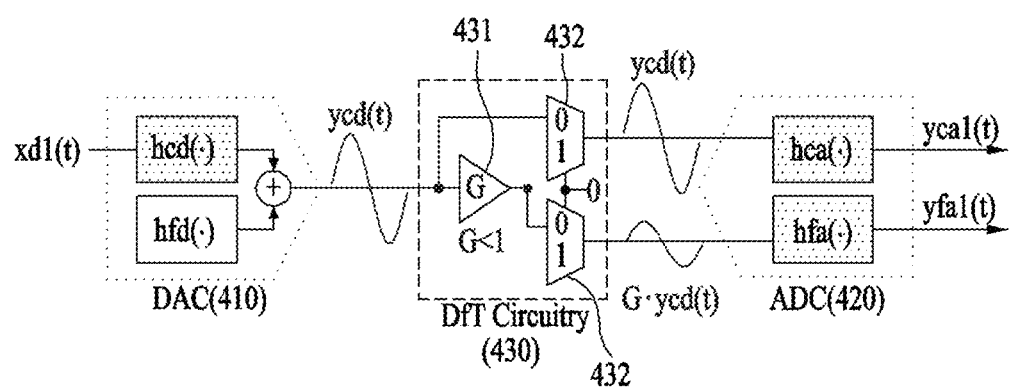
FIGS. 4A and 4B illustrate a first loopback configuration and a second loopback configuration according to an embodiment of the inventive concept.
Figure 4B:
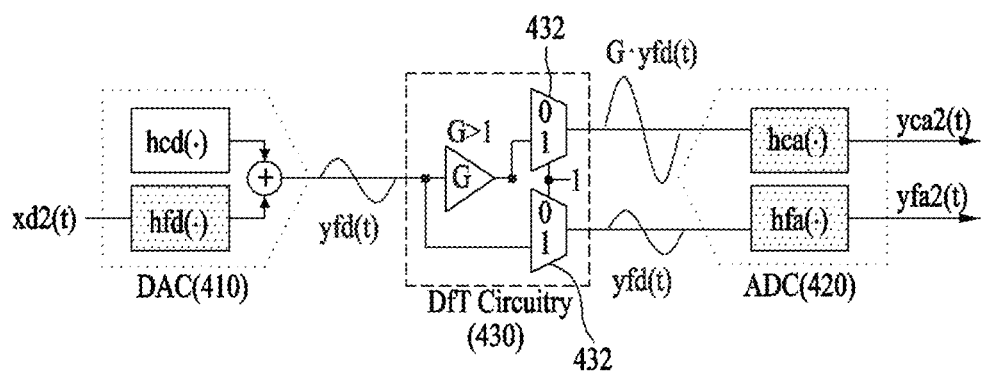

FIG. 3 illustrates a loopback configuration proposed for a load board or a PCB according to an embodiment of the inventive concept, and FIGS. 4A and 4B illustrate a first loopback configuration and a second loopback configuration according to an embodiment of the inventive concept.

FIG. 3 shows proposed loopback test configurations for a load board, and includes an on-chip DUT 310 and a DfT circuitry 320.

Referring to FIG. 3, a nonlinear coarse/fine DAC channel 311 and a coarse/fine ADC channel 312 may be represented using transfer functions such as hcd, hfd, hca, and hfa, respectively. In a first loopback or the test mode of the first loopback, the DfT circuitry 320 may be used, and the DfT circuitry 320 includes a PGA 321 and two analog multiplexers (MUXes) 322, such that each sub-DAC channel output signal can fit into the input full-scale range of each sub-ADC channel.

Two outputs of the DfT circuitry 320 may be looped back to CA IN and FA IN which are additional input terminals of the ADC, for test purposes. Then, those inputs are connected to hca and hfa through two input switches 313 present in the ADC, and then the outputs of hca and hfa, i.e., yca(t) and yfa(t), are connected to the on-chip digital core through additional output switches 314 for test purpose.

For simplicity, even though the input signals of the DAC or the output signals of the ADC are digital, the conventional discrete time notation n (e.g., y(t)) is used. For DACs and ADCs, a smoothing filter, anti-aliasing filter, and analog buffers are omitted. In addition, it is assumed that an identical sampling rate is used for both a DAC and an ADC, and that the sampling time of a DAC is synchronized with that of an ADC, as in conventional loopback testing.

The test modes of the first loopback and the second loopback according to the embodiment of the inventive concept shown in FIG. 3 will be clarified as shown in FIGS. 4A and 4B.

The coarse loopback test, which is the first loopback shown in FIG. 4A, and the fine loopback test, which is the second loopback, shown in FIG. 4B are sequentially performed in the test mode.

For the coarse loopback test shown in FIG. 4A, a DfT circuitry 430 is reconfigured by setting L=0 to set a gain "G" 431 to a value less than unity for scaling down the coarse DAC output, and to select the input 0 of all the two MUXes 432. Accordingly, the coarse loopback test configuration shown in FIG. 4A is realized.

An on-chip digital processor may generate a single-tone sinusoidal stimulus $x_{d1}(t)=\cos(\omega_0 t)$, which is represented only in the MSBs of an overall DAC input (i.e., all zeros in the LSBs) for test purpose. Accordingly, xd1(t) is applied to a coarse DAC, that is, hcd only, and a fine DAC, that is, hfd does not participate in this loopback test.

ycd (t) exhibits the dynamic nonlinearity introduced by hcd, which may be modeled using a Taylor expansion as [Equation 1]

$$y_{cd}(t)=\mu_1 \cos(\omega_0 t)+\mu_2 \cos^2(\omega_0 t)+\mu_3 \cos^3(\omega_0 t) \quad \text{[Equation 1]}$$

where $\mu_i$ indicates the i-th order harmonic coefficient of the coarse DAC. In the inventive concept, harmonic distortion up to the third order is considered for better understanding, but the inventive concept is not limited to the third order, and may extend to higher orders.

ycd (t) which is the output of the DAC 410 may be then fed to the DfT circuitry 430, and the DfT circuitry 430 may include two parallel signal paths: a PGA path and a bypass path. The bypass path output simply becomes ycd (t) from the DAC output. On the other hand, $G \cdot y_{cd}(t)_{(G<1)}$ which is the PGA path output is determined by applying the DAC output to the PGA path. Accordingly, ycd (t) and $G \cdot y_{cd}(t)$ which are outputs of the DIT circuitry 430, may fit into the full-scale (or −1 dBFS) input ranges of the coarse ADC (hca) and the fine ADC (hfa) respectively, for precise performance evaluation. Finally, yca1(t) and yfa1(t) may be obtained simultaneously as shown in [Equation 2] below by applying ycd(t) and $G \cdot y_{cd}(t)$ to hca and hfa, respectively.

$$y_{ca1}(t)=\rho_1 y_{cd}(t)+\rho_2 y_{cd}^2(t)+\rho_3 y_{cd}^3(t)$$

$$y_{fa1}(t)=\eta_1 G \cdot y_{cd}(t)+\eta_2 (G \cdot y_{cd}(t))^2(t)+\eta_3 (G \cdot y_{cd}(t))^3 \quad \text{[Equation 2]}$$

where $\rho_i$ and $\eta_i$ represent the i-th order harmonic coefficients of a coarse ADC and a fine ADC, respectively, yca1(t) in [Equation 2] exhibits the correlation between $\rho_i$ of hca and $\mu_i$ of hcd.

$Y_{ca1}(\omega)$, which is the spectral representation of yca1(t), may include the mathematical expressions of the three harmonic coefficients which are correlated with $\rho_i$ and $\mu_i$. Then, those coefficients' expressions are identical to the harmonic magnitudes experimentally measured from a coarse ADC output, i.e., $|Y_{ca1}(\omega_0)|$, $|Y_{ca1}(2\omega_0)|$ and $|Y_{ca1}(3\omega_0)|$. From those relations, the three simultaneous equations may be obtained.

Similarly, yfa1(t) in [Equation 2] represents the correlation of $\eta_i$ and $\mu_i$ of hfa.

$Y_{fa1}(\omega)$, that is, the spectral expression of yfa1(t), shows the mathematical expressions of the three harmonic coefficients correlated with of $\eta_i$ and $\mu_i$, which may be quantified as the harmonic magnitudes, i.e., $|Y_{fa1}(i\omega_0)|$ experimentally measured from a fine ADC output. Another set of three correlation equations can be then obtained from the above relations. Accordingly, the built-in harmonic prediction method according to an embodiment of the inventive concept may derive total six correlation equations to complete the first-order loopback, that is coarse loopback test.

For the fine loopback test which is the second loopback test shown in FIG. 4B, the DfT circuitry 430 may be reconfigured by setting L=1 to set the gain G 431 to a value greater than unity for scaling up a DAC output, and to select input 1 of all the two MUXes 432. Accordingly, the fine loopback test configuration shown in FIG. 4B is realized.

The on-chip digital processor may produce a sinusoid, xd2(t), which is expressed only in the LSBs of an overall DAC input (i.e., all zeros in the MSBs) for test purpose. xd2(t) is then applied to a fine DAC, that is, hfd only, yfd (t) exhibits the dynamic nonlinearity introduced by hfd and may be modeled as in [Equation 3] below.

$$y_{fd}(t)=\varepsilon_1 \cos(\omega_0 t)+\varepsilon_2 \cos^2(\omega_0 t)+\varepsilon_3 \cos^3(\omega_0 t) \quad \text{[Equation 3]}$$

where $\varepsilon_i$ is the i-th order harmonic coefficient of the fine DAC. yfd (t) is then applied to the DfT circuitry 430, and a bypass path output simply becomes yfd(t) from the DAC output. On the other hand, a PGA path output $G \cdot y_{fd}(t)_{(G>1)}$ is determined by applying the DAC output to the PGA path. Thus, yfd(t) and $G \cdot y_{fd}(t)$, which are the outputs of the DfT circuitry 430, may fit into the full-scale input ranges of a fine ADC (hfa) and the coarse ADC (hca), respectively. In this case, yca2(t) and yfa2(t) are simultaneously obtained as shown in [Equation 4] below, by applying $G \cdot y_{fd}(t)$ and yfd (t) to hca and hfa individually.

$$y_{ca2}(t)=\eta_1 \cdot y_{fd}(t)+\eta_2(G \cdot y_{fd}(t))^2+\eta_3(G \cdot y_{fd}(t))^3$$

$$y_{fa2}(t)=\rho_1 y_{fd}(t)+\rho_2 y_{fd}^2(t)+\rho_3 y_{fd}^3(t) \quad \text{[Equation 4]}$$

Here, yca2(t) in [Equation 4] represents the correlation between $\rho_i$ of hca and $\varepsilon_i$ of hfa.

$Y_{ca2}(\omega)$, that is, the spectral expression of yca2(t), represents the mathematical representation of the harmonic coefficients consisting of $\rho_i$ and $\varepsilon_i$, that are equal to the harmonic magnitudes, i.e., $|Y_{ca1}(i\omega_0)|$ measured from a coarse ADC output. In addition, the built-in harmonic prediction method according to an embodiment of the inventive concept may also obtain three simultaneous equations in the above-described relations.

Similarly, yfa2(t) in [Equation 4] represents a correlation of $\eta_i$ and $\varepsilon_i$.

$Y_{fa2}(\omega)$, that is, the spectral expression of yfa2(t) represents the equation of the harmonic coefficient correlated with $\eta_i$ and $\varepsilon_i$, which is the same as the harmonic amplitude, that is, $|Y_{fa2}(i\omega_0)|$ experimentally measured at the fine ADC output. Then, three simultaneous equations may be obtained from the above relations. Accordingly, the built-in harmonic prediction method according to an embodiment of the inventive concept may derive total six simultaneous equations to complete the second-order loopback, that is fine loopback test.

Finally, in post-processing, the built-in harmonic prediction method according to an embodiment of the inventive concept may identify twelve harmonic coefficients ($\mu_1$–3, $\varepsilon_1$–3, $\rho_1$–3, and $\eta_1$–3) obtained from the DAC and the ADC by solving total twelve simultaneous equations obtained through loopback testing. Therefore, in production testing, when the spectral loopback responses are experimentally measured and they are input into the solutions of the simultaneous equations, individual harmonic coefficients of the coarse DAC, the fine DAC, the coarse ADC, and the fine ADC are readily predicted, thereby obtaining the harmonic coefficients of an overall DAC/ADC using the sub-DAC/ADC output combination calculation.

In the loopback test of the first loopback and the second loopback, the resolution relations between the sub-DAC and the sub-ADC follows resolution relations of the conventional loopback testing. Accordingly, more accurate test results may be obtained when the resolution of the DAC is two bits higher than that of the ADC.

Figure 5A:
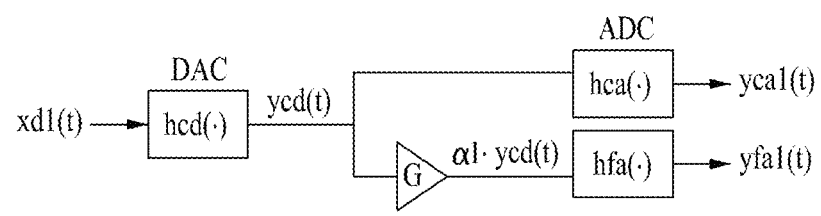
FIGS. 5A and 5B illustrate quantitative models for a first-order loopback and a second-order loopback according to an embodiment of the inventive concept.
Figure 5B:
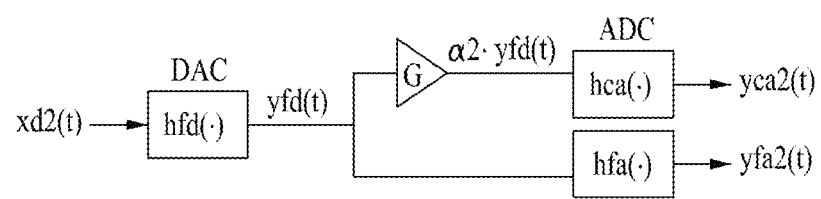
Figure 6:
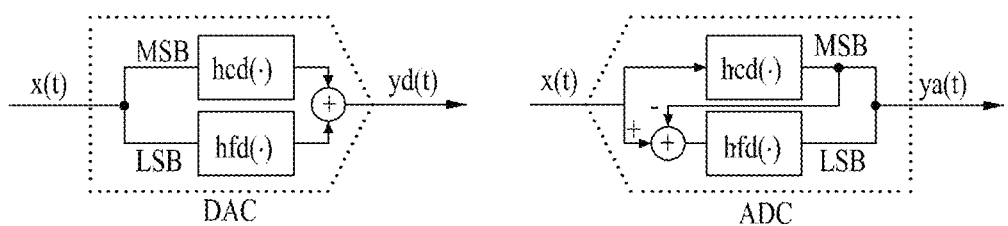
FIG. 6 illustrates segmented DAC and ADC models according to an embodiment of the inventive concept.

FIGS. 5A and 5B illustrate quantitative models for a first-order loopback and a second-order loopback according to an embodiment of the inventive concept, and FIG. 6 illustrates segmented DAC and ADC models according to an embodiment of the inventive concept.

Referring to FIG. 5A, in a coarse loopback test, which is a first-order loopback, ycd(t) and its spectrum expression $Y_{cd}(\omega)$ may be derived as [Equation 5] below by applying a test stimulus $x_{d1}(t)=\cos(\omega_0 t)$ to hcd.

$$y_{cd}(t) = \sum_{i=1}^{3} \mu_i x_{d1}^i(t) = \sum_{i=1}^{3} \overline{\mu}_i \cos(i\omega_0 t) \quad \text{[Equation 5]}$$

$$y_{cd}(\omega) = \sum_{i=1}^{3} \pi \overline{\mu}_i \delta(\omega - i\omega_0)$$

where $\overline{\mu}_1 = \mu_1 + 3\mu_3/4, \overline{\mu}_2 = \mu_2/2$ and $\overline{\mu}_3 = \mu_3/4$.

addition, yca1(t) and its spectrum expression $Y_{ca1}(\omega)$ derived through [Equation 6] below by applying to hca of the ADC.

$$y_{cd1}(t) = \sum_{i=1}^{3} \rho_i y_{cd}^j(t) \quad \text{[Equation 6]}$$

$$Y_{cd1}(\omega) = \sum_{i=1}^{3} \rho_i (2\pi)^{1-i} Y_{cd}^{*(i-1)}(\omega)$$

$$= \rho_1 Y_{cd}(\omega) + \frac{\rho_2}{2\pi} Y_{cd}^{*1}(\omega) + \frac{\rho_3}{(2\pi)^2} Y_{cd}^{*2}(\omega)$$

$$= \overline{\rho}_1 \delta(\omega - \omega_0) + \overline{\rho}_2 \delta(\omega - 2\omega_0) + \overline{\rho}_3 \delta(\omega - 3\omega_0)$$

where $Y_{cd}^{*1}(\omega) = (Y_{cd,f}(\omega) + Y_{cd,h}(\omega))^{*1} =$ $$Y_{cd,f}^{*1}(\omega) + 2(Y_{cd,f}(w) * Y_{cd,h}(\omega)) + Y_{cd,h}^{*1}(\omega).$$

in addition, $Y_{cd,f}(\omega)$ represents the spectral fundamental term, and $Y_{cd,h}(\omega)$ indicates a sum of the second and the third harmonics from $Y_{cd}(\omega)$. *i indicates the i-fold iteration of the convolution with itself. $Y_{cd}^{*2}(\omega)$ may be similarly derived.

Finally, $Y_{cd}^{*(i-1)}(\omega)$ in [Equation 6] is obtained, and using those values, $\overline{\rho}_i$ in [Equation 6] may be identified as in [Equation 7] below.

$$\overline{\rho}_1 = \pi \overline{\mu}_1 \rho_1 + \pi(\overline{\mu}_1 + \overline{\mu}_3)\overline{\mu}_2 \rho_2 + \quad \text{[Equation 7]}$$

$$\frac{3}{4}\pi\{\overline{\mu}_1^3 + (\overline{\mu}_1^2 + \overline{\mu}_2^2)\overline{\mu}_3 + 2\overline{\mu}_1(\overline{\mu}_2^2 + \overline{\mu}_3^2)\}\rho_3$$

$$\overline{\rho}_2 = \pi \overline{\mu}_2 \rho_1 + \pi\left(\frac{\overline{\mu}_1}{2} + \overline{\mu}_3\right)\overline{\mu}_1 \rho_2 +$$

$$\frac{3}{4}\pi\{2(\overline{\mu}_1^2 + \overline{\mu}_3^2)\overline{\mu}_2 + 2\overline{\mu}_1 \overline{\mu}_2 \overline{\mu}_3 + \overline{\mu}_2^3\}\rho_3$$

$$\overline{\rho}_3 = \pi \overline{\mu}_3 \rho_1 + \pi \overline{\mu}_1 \overline{\mu}_2 \rho_2 +$$

$$\frac{3}{4}\pi\{2(\overline{\mu}_1^2 + \overline{\mu}_2^2)\overline{\mu}_3 + \frac{\overline{\mu}_1^3}{3} + \overline{\mu}_3^3 + \overline{\mu}_1 \overline{\mu}_2^2\}\rho_3$$

As shown in [Equation 6], $\overline{\rho}_i$ represents the harmonic coefficients $|Y_{ca1}(i\omega_0)|$ experimentally measured from the output of hca.

Simultaneously, in the built-in harmonic prediction method according to an embodiment of the inventive concept, ycd(t) may be scaled down to $|G(\omega)|y_{cd}(t)$ which fits into the full scale input range of hfa by applying ycd(t) to the amplifier G(ω). In this case, for simplicity, it is assumed that the gain is a constant value $\alpha_1$ in the passband, and the phase may be processed as in [Equation 8].

$$G(\omega)|_{\omega=i\omega_0} = |G(i\omega_0)|e^{jG(i\omega_0)} \approx \alpha_1 \quad \text{[Equation 8]}$$

Furthermore, yfa1(t) or Yfa1(ω) may be obtained by applying $\alpha_1 y_{cd}(t)$ to hfa as in [Equation 9] below.

$$y_{fa1}(t) = \sum_{i=1}^{3} \eta_i (\alpha_1 y_{cd}(t))^i \quad \text{[Equation 9]}$$

$$Y_{fa1}(\omega) = \sum_{i=1}^{3} \eta_i \alpha_1^i (2\pi)^{1-i} Y_{cd}^{*(i-1)}(\omega)$$

$$= \eta_1 \alpha_1 Y_{cd}(\omega) + \frac{\eta_2}{2\pi} \alpha_1^2 Y_{cd}^{*1}(\omega) + \frac{\eta_3}{(2\pi)^2} \alpha_1^3 Y_{cd}^{*2}(\omega)$$

$$= \overline{\eta}_1 \delta(\omega - \omega_0) + \overline{\eta}_2 \delta(\omega - 2\omega_0) + \overline{\eta}_3 \delta(\omega - 3\omega_0)$$

Also, as in [Equation 6], $\overline{\eta}_i$ in [Equation 9] may be obtained by using $Y^{*(i-1)}_{cd}(\omega)$ $$\overline{\eta}_1 = \pi \alpha_1 \overline{\mu}_1 \eta_1 + \pi \alpha_1^2 (\overline{\mu}_1 + \overline{\mu}_3) \overline{\mu}_2 \eta_2 + \quad \text{[Equation 10]}$$
$$\frac{3}{4} \pi \alpha_1^3 \{\overline{\mu}_1^3 + (\overline{\mu}_1^2 + \overline{\mu}_2^2)\overline{\mu}_3 + 2\overline{\mu}_1 (\overline{\mu}_2^2 + \overline{\mu}_3^2)\}\eta_3$$

$$\overline{\eta}_2 = \pi \alpha_1 \overline{\mu}_2 \eta_1 + \pi \alpha_1^2 \left(\frac{\overline{\mu}_1}{2} + \overline{\mu}_3\right) \overline{\mu}_1 \eta_2 + $$
$$\frac{3}{4} \pi \alpha_1^3 \{2(\overline{\mu}_1^2 + \overline{\mu}_3^2)\overline{\mu}_2 + 2\overline{\mu}_1 \overline{\mu}_2 \overline{\mu}_3 + \overline{\mu}_2^3\}\eta^3$$

$$\overline{\eta}_3 = \pi \alpha_1 \overline{\mu}_3 \eta_1 + \pi \alpha_1^2 \overline{\mu}_1 \overline{\mu}_2 \eta_2 + $$
$$\frac{3}{4} \pi \alpha_1^3 \left\{2(\overline{\mu}_1^2 + \overline{\mu}_2^2)\overline{\mu}_3 + \frac{\overline{\mu}_1^3}{3} + \overline{\mu}_3^3 + \overline{\mu}_1 \overline{\mu}_2^2\right\}\eta_3$$

where $\overline{\eta}_i$ also indicates the harmonic coefficients $|Y^*_{fa1}(i\omega_0)|$ experimentally measured from the output of hfa.

Referring to FIG. 5B, in the fine loopback test, which is the second loopback, yfd(t) or Yfd(ω) may be obtained as shown in FIG. 5B and [Equation 11] below by applying another test stimulus $x_{d2}(t) = \kappa \cos(\omega_0 t)$ to hfd. Since k is a constant value less than unity, xd2(t) may be expressed only in the LSBs of the DAC input for hfa.

$$Y_{fd}(t) = \sum_{i=1}^{3} \varepsilon_i x_{d2}^i(t) = \sum_{i=1}^{3} \overline{\varepsilon}_i \cos(i\omega_0 t) \quad \text{[Equation 11]}$$

$$Y_{fd}(\omega) = \sum_{i=1}^{3} \pi \overline{\varepsilon}_i \delta(\omega - i\omega_0)$$

where $\overline{\varepsilon}_1 \sim \varepsilon_{1\kappa} + 3\varepsilon_3 \kappa^3/4$, $\overline{\varepsilon}_2 = \varepsilon_2 \kappa^2/2$, and $\overline{\varepsilon}_3 = \varepsilon_3 \kappa^3/4$. yfd(t) is then applied to G(ω) to be scaled up to $|G(\omega)|y_{fd}(t)$ whose magnitude fits into the full-scale input range of hca. In this case, as in [Equation 8], it is assumed that the gain is a constant value $\alpha_2$ in a passband, and the gain may be processed as in [Equation 12]

$$G(\omega)|_{\omega=i\omega_0} = |G(i\omega_0)|e^{jG(i\omega_0)} \approx \alpha_2 \quad \text{[Equation 12]}$$

Then, yca2(t) or Yca2(ω) is measured by applying $\alpha_2 y_{fd}(t)$ to hca (see [Equation 13] below).

$$y_{ca2}(t) = \sum_{i=1}^{3} \rho_i (\alpha_2 y_{fd}(t))^i \quad \text{[Equation 13]}$$

$$y_{ca2}(\omega) = \sum_{i=1}^{3} \rho_i \alpha_2^i (2\pi)^{1-i} Y_{fd}^{*(i-1)}(\omega)$$

$$= \rho_1 \alpha_2 Y_{fd}(\omega) + \frac{\rho_2}{2\pi} \alpha_2^2 Y_{fd}^{*1}(\omega) + \frac{\rho_3}{(2\pi)^2} \alpha_2^3 Y_{fd}^{*2}(\omega)$$

$$= \hat{\rho}_1 \delta(\omega - \omega_0) + \hat{\rho}_2 \delta(\omega - 2\omega_0) + \hat{\rho}_3 \delta(\omega - 3\omega_0)$$

where $Y^{*1}_{fd}(\omega) = Y_{fd,f}(\omega) + Y_{fd,h}(\omega))^{*1} = Y^{*1}_{fd,f}(\omega) + 2(Y_{fd,f}(\omega)^*Y_{fd,h}(\omega)) + Y^{*1}_{fd,h}(\omega)$. Similarly, $Y_{fd,f}(\omega)$ represents the spectral fundamental term, and $Y_{fd,h}(\omega)$ indicates a sum of the second and the third harmonics from $Y_{fd}(\omega)$. $Y^{*2}_{fd}(\omega)$ may be derived in the same way, and finally $Y^{*(i-1)}_{fd}(\omega)$ in [Equation 13] is identified.

Based on these, $\hat{\rho}_i$ in [Equation 13] may be derived as in [Equation 14] below.

$$\hat{\rho}_1 = \pi \alpha_2 \overline{\varepsilon}_1 \rho_1 + \pi \alpha_2^2 (\overline{\varepsilon}_1 + \overline{\varepsilon}_3) \overline{\varepsilon}_2 \rho_2 + \quad \text{[Equation 14]}$$
$$\frac{3}{4} \pi \alpha_2^3 \{\overline{\varepsilon}_1^3 + (\overline{\varepsilon}_1^2 + \overline{\varepsilon}_2^2)\overline{\varepsilon}_3 + 2\overline{\varepsilon}_1 (\overline{\varepsilon}_2^2 + \overline{\varepsilon}_3^2)\}\rho_3$$

$$\hat{\rho}_2 = \pi \alpha_2 \overline{\varepsilon}_2 \rho_1 + \pi \alpha_2^2 \left(\frac{\overline{\varepsilon}_1}{2} + \overline{\varepsilon}_3\right)\overline{\varepsilon}_1 \rho_2 + $$
$$\frac{3}{4} \pi \alpha_2^3 \{2(\overline{\varepsilon}_1^2 + \overline{\varepsilon}_3^2)\overline{\varepsilon}_2 + 2\overline{\varepsilon}_1 \overline{\varepsilon}_2 \overline{\varepsilon}_3 + \overline{\varepsilon}_2^3\}\rho_3$$

$$\hat{\rho}_3 = \pi \alpha_2 \overline{\varepsilon}_3 \rho_1 + \pi \alpha_2^2 \overline{\varepsilon}_1 \overline{\varepsilon}_2 \rho_2 + $$
$$\frac{3}{4} \pi \alpha_2^3 \left\{2(\overline{\varepsilon}_1^2 + \overline{\varepsilon}_2^2)\overline{\varepsilon}_3 + \frac{\overline{\varepsilon}_1^3}{3} + \overline{\varepsilon}_3^3 + \overline{\varepsilon}_1 \overline{\varepsilon}_2^2\right\}\rho_3$$

where $\hat{\rho}_i$ indicates the harmonic coefficients $|Y_{ca2}(i\omega_0)|$ experimentally measured from the output of hca.

At the same time, yfd(t) is applied to hfa to measure yfa2(t) or Yfa2(ω) (see [Equation 15] below).

$$y_{fa2}(t) = \sum_{i=1}^{3} \eta_i y_{fd}^i(t) \quad \text{[Equation 15]}$$

$$Y_{fa2}(\omega) = \sum_{i=1}^{3} \eta_i (2\pi)^{1-i} Y_{fd}^{*(i-1)}(\omega)$$

$$= \eta_1 Y_{fd}(\omega) + \frac{\eta_2}{2\pi} Y_{fd}^{*1}(\omega) + \frac{\eta_3}{(2\pi)^2} Y_{fd}^{*2}(\omega)$$

$$= \hat{\eta}_1 \delta(\omega - \omega_0) + \hat{\eta}_2 \delta(\omega - 2\omega_0) + \hat{\eta}_3 \delta(\omega - 3\omega_0)$$

Furthermore, by using $Y^{*(i-1)}_{fd}(\omega)$ in [Equation 13], $\hat{\eta}_i$ in [Equation 15] may be derived as follows.

$$\hat{\eta}_1 = \omega \overline{\varepsilon}_1 \eta_1 + \pi(\overline{\varepsilon}_1 + \overline{\varepsilon}_3)\overline{\varepsilon}_2 \eta_2 + \quad \text{[Equation 16]}$$
$$\frac{3}{4} \pi \{\overline{\varepsilon}_1^3 + (\overline{\varepsilon}_1^2 + \overline{\varepsilon}_2^2)\overline{\varepsilon}_3 + 2\overline{\varepsilon}_1 (\overline{\varepsilon}_2^2 + \overline{\varepsilon}_3^2)\}\eta_3$$

$$\hat{\eta}_2 = \omega \overline{\varepsilon}_2 \eta_1 + \pi\left(\frac{\overline{\varepsilon}_1}{2} + \overline{\varepsilon}_3\right)\overline{\varepsilon}_1 \eta_2 + $$
$$\frac{3}{4} \pi \{2(\overline{\varepsilon}_1^2 + \overline{\varepsilon}_3^2)\overline{\varepsilon}_2 + 2\overline{\varepsilon}_1 \overline{\varepsilon}_2 \overline{\varepsilon}_3 + \overline{\varepsilon}_2^3\}\eta_3$$

$$\hat{\eta}_3 = \pi \overline{\varepsilon}_3 \eta_1 + \pi \overline{\varepsilon}_1 \overline{\varepsilon}_2 \eta_2 + $$

-continued $$\frac{3}{4}\pi^3\left\{2(\bar{\varepsilon}_1^2+\bar{\varepsilon}_2^2)\bar{\varepsilon}_3+\frac{\bar{\varepsilon}_1^3}{3}+\bar{\varepsilon}_3^3+\bar{\varepsilon}_1\bar{\varepsilon}_2^2\right\}\eta_3$$

where $\hat{\eta}_i$ also represents the harmonic coefficients $|Y_{fa2}(i\omega_0)|$ experimentally measured from the output of hfa.

Finally, the built-in harmonic prediction method according to an embodiment of the inventive concept may derive total twelve simultaneous equations as shown in [Equation 7], [Equation 10], [Equation 14], and [Equation 16]. Thus, when the twelve loopback responses $(\bar{\rho}_i, \bar{\eta}_i, \hat{\rho}_i, \hat{\eta}_i)$ are experimentally measured from the first and second loopback measurements, and are input to the simultaneous equations, then the harmonic coefficients $(\mu_i, \varepsilon_i, \rho_i, \eta_i)$ of the coarse DAC/ADC and the fine DAC/ADC may be readily obtained. Then, the those obtained harmonic coefficients are then applied to the transfer functions, [Equation 17] for each of the coarse and fine DACs/ADCs, which are derived using a symmetric Taylor expansion, as in [Equation 5].

$$h_{sub}(x(t)) = \sum_{i=1}^{3} \ell_i x^i(t) \qquad \text{[Equation 17]}$$

where x(t) is an input signal, hsub represents hcd, hfd, hca, and hfa, and also indicates $\mu_i, \varepsilon_i, \rho_i, \eta_i$, respectively.

FIG. 6 shows conventional segmented DAC and ADC models as described with reference to FIG. 3.

Referring to FIG. 6, each corresponding transfer function [Equation 17] is applied to hcd, hfd, hca, and hfa in the the DAC and ADC models of x(t)=cos($\omega_0$ t), and yd(t) is applied to the ADC model. An output of yd(t) or ya(t) may be obtained using the conventional combination process as in conventional segmented architecture.

Finally, the total-harmonic-distortion (THD) for each of the DAC and ADC may be obtained from the spectral calculation of yd(t) and ya(t). In addition, nonlinearities caused by the inter stage errors such as inter stage gain and offset errors may be addressed in yd (t) (or ya(t)) by conducting the combination process of the outputs from the sub-DACs or sub-ADCs.

Figure 7:
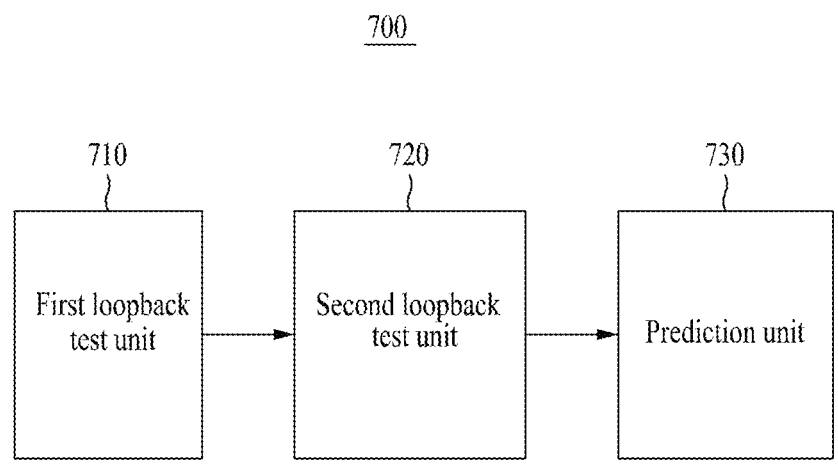
FIG. 7 is a block diagram showing a detailed configuration of a built-in harmonic prediction system for an embedded segmented data converter according to an embodiment of the inventive concept.

FIG. 7 is a block diagram showing a detailed configuration of a built-in harmonic prediction system for an embedded segmented data converter according to an embodiment of the inventive concept.

Referring to FIG. 7, in a built-in harmonic prediction system according to an embodiment of the inventive concept may cost-effectively predict the dynamic nonlinearities of on-chip segmented digital-to-analog converter (DAC) and analog-to-digital-converter (ADC), by looping a DAC to an ADC, using a programmable-gain-amplifier (PGA) and an external load board.

To this end, a built-in harmonic prediction system 700 according to an embodiment of the inventive concept may include a first loopback test unit 710, a second loopback test unit 720, and a prediction unit 730.

The first loopback test unit 710 may supply an output signal from a coarse DAC, to which a sinusoidal signal is supplied, to a coarse ADC and a fine ADC through an external load board.

Specifically, the first loopback test unit 710 may supply the sinusoidal signal to the coarse DAC and bypass the fine DAC. The first loopback test unit 710 may supply the output signal from the coarse DAC to the coarse ADC through a bypass path on the load board, and supply the output signal from the coarse DAC to the input full-scale range of the fine ADC through a PGA path of the load board.

The second loopback test unit 720 may supply an output signal from the fine DAC, to which a sinusoidal signal is supplied, to the fine ADC and the coarse ADC through the load board.

Specifically, the second loopback test unit 720 may supply the sinusoidal signal to the fine DAC, and bypass the coarse DAC. The second loopback test unit 720 may supply the output signal from the fine DAC to the fine ADC through a bypass path on the load board, and supply the output signal from the fine DAC to the input full-scale range of the coarse ADC through a PGA path of the load board.

The prediction unit 730 may process dynamic nonlinearity of a sub-DAC and a sub-ADC and equations obtained in the first loopback test unit 710 and the second loopback test unit 720 to predict the dynamic nonlinearity of each of a DAC and an ADC.

The prediction unit 730 may predict the dynamic nonlinearity of each of the DAC and the ADC by processing six simultaneous equations obtained in the first loopback test unit 710 and six simultaneous equations obtained in the second loopback test unit 720. In a post-processing process, the prediction unit 730 may obtain twelve harmonic coefficients obtained from the DAC and ADC by solving the twelve simultaneous equations.

Accordingly, the prediction unit 730 may predict the dynamic nonlinearity of each of the DAC and the ADC by performing an output combination process of the sub-DAC or sub-ADC.

Although the description is omitted with reference to the system of FIG. 7, the system according to the inventive concept may include all the contents described with reference to FIGS. 2 to 6, which are obvious to those skilled in the art.

The system or apparatus described herein may be implemented with hardware components and software components and/or a combination of the hardware components and the software components. For example, the apparatus and components described in the embodiments may be implemented using one or more general-purpose or special purpose computers, such as a processor, a controller, an arithmetic logic unit (ALU), a digital signal processor, a microcomputer, a field programmable array (FPGA), a programmable logic unit (PLU), a microprocessor or any other device capable of executing and responding to instructions. The processing device may run an operating system (OS) and one or more software applications that run on the OS. The processing device also may access, store, manipulate, process, and create data in response to execution of the software. For convenience of understanding, one processing device is described as being used, but those skilled in the art will appreciate that the processing device includes a plurality of processing elements and/or multiple types of processing elements. For example, the processing device may include multiple processors or a single processor and a single controller. In addition, different processing configurations are possible, such a parallel processors.

The software may include a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. In particular, the software and data may be stored by one or more computer readable recording mediums.

The above-described methods may be embodied in the form of program instructions that can be executed by various computer means and recorded on a computer-readable medium. The computer readable medium may include program instructions, data files, data structures, and the like, alone or in combination. Program instructions recorded on the media may be those specially designed and constructed for the purposes of the inventive concept, or they may be of the kind well-known and available to those having skill in the computer software arts. Examples of computer readable recording media include magnetic media such as hard disks, floppy disks and magnetic tape, optical media such as CD-ROMs, DVDs, and magnetic disks such as floppy disks, Magneto-optical media, and hardware devices specifically configured to store and execute program instructions, such as ROM, RAM, flash memory, and the like. Examples of program instructions include not only machine code generated by a compiler, but also high-level language code that can be executed by a computer using an interpreter or the like. The hardware device described above may be configured to operate as one or more software modules to perform the operations of the inventive concept, and vice versa.

Although the embodiments have been described by the limited embodiments and the drawings as described above, various modifications and variations are possible to those skilled in the art from the above description. For example, the described techniques may be performed in a different order than the described method, and/or components of the described systems, structures, devices, circuits, etc. may be combined or combined in a different form than the described method, or other components, or even when replaced or substituted by equivalents, an appropriate result can be achieved.

Therefore, other implementations, other embodiments, and equivalents to the claims are within the scope of the following claims.

What is claimed is:

1. A built-in harmonic prediction method for embedded segmented data converters, comprising:
   a first loopback step of supplying an output signal from a coarse DAC, to which a sinusoidal signal is supplied, to a coarse ADC and a fine ADC through an external load board;
   a second loopback step of supplying an output signal from a fine DAC, to which a sinusoidal signal is supplied, to the fine ADC and the coarse ADC through the load board; and
   a step of predicting dynamic nonlinearity of each of a DAC and an ADC by processing equations exhibiting dynamic nonlinearity of a sub-DAC and a sub-ADC, which are obtained in the first loopback step and the second loopback step.

2. The built-in harmonic prediction method of claim 1, wherein the first loopback step includes supplying the sinusoidal signal to the coarse DAC and bypassing the fine DAC.

3. The built-in harmonic prediction method of claim 2, wherein the first loopback step includes supplying the output signal from the coarse DAC to the coarse ADC through a bypass path of the load board and supplying the output signal from the coarse DAC to an input full-scale range of the fine ADC through a PGA path of the load board.

4. The built-in harmonic prediction method of claim 1, wherein the second loopback step includes supplying the sinusoidal signal to the fine DAC and bypassing the coarse DAC.

5. The built-in harmonic prediction method of claim 4, wherein the second loopback step includes supplying the output signal from the fine DAC to the fine ADC through a bypass path of the load board, and supplying the output signal from the fine DAC to an input full-scale range of the coarse ADC through a PGA path of the load board.

6. The built-in harmonic prediction method of claim 1, wherein the step of predicting the dynamic nonlinearity includes predicting nonlinearity caused by inter stage errors introduced by conducting a combination process of outputs from the sub-DAC or the sub-ADC.

7. The built-in harmonic prediction method of claim 6, wherein the step of predicting the dynamic nonlinearity includes predicting the dynamic nonlinearity of each of the DAC and the ADC by processing six simultaneous equations obtained in the first loopback step and six simultaneous equations obtained in the second loopback step.

8. The built-in harmonic prediction method of claim 7, wherein the step of predicting the dynamic nonlinearity includes obtaining twelve harmonic coefficients obtained from the DAC and the ADC by solving the twelve simultaneous equations in a post-processing process.

9. A built-in harmonic prediction system for embedded segmented data converters, comprising:
   a first loopback test unit configured to supply an output signal from a coarse DAC, to which a sinusoidal signal is supplied, to a coarse ADC and a fine ADC through an external load board;
   a second loopback test unit configured to supply an output signal from a fine DAC, to which a sinusoidal signal is supplied, to the fine ADC and the coarse ADC through the load board; and
   a prediction unit configured to predict dynamic nonlinearity of each of a DAC and an ADC by processing equations exhibiting dynamic nonlinearity of a sub-DAC and a sub-ADC, which are obtained in the first loopback test unit and the second loopback test unit.

10. The built-in harmonic prediction system of claim 9, wherein the first loopback test unit supplies the sinusoidal signal to the coarse DAC and bypasses the fine DAC.

11. The built-in harmonic prediction system of claim 10, wherein the first loopback test unit supplies the output signal from the coarse DAC to the coarse ADC through a bypass path of the load board, and supplies the output signal from the coarse DAC to an input full-scale range of the fine ADC through a PGA path of the load board.

12. The built-in harmonic prediction system of claim 9, wherein the second loopback test unit supplies the sinusoidal signal to the fine DAC and bypasses the coarse DAC.

13. The built-in harmonic prediction system of claim 12, wherein the second loopback test unit supplies the output signal from the fine DAC to the fine ADC through a bypass path of the load board, and supplies the output signal from the fine DAC to an input full-scale range of the coarse ADC through a PGA path of the load board.

14. The built-in harmonic prediction system of claim 9, wherein the prediction unit predicts nonlinearity caused by inter stage errors introduced by conducting a combination process of outputs from the sub-DAC or the sub-ADC.

15. The built-in harmonic prediction system of claim 14, wherein the prediction unit predicts the dynamic nonlinearity of each of the DAC and the ADC by processing six simultaneous equations obtained in the first loopback test unit and six simultaneous equations obtained in the second loopback test unit.

16. The built-in harmonic prediction system of claim 15, wherein the prediction unit obtains twelve harmonic coefficients obtained from the DAC and the ADC by solving the twelve simultaneous equations in a post-processing process.

* * * * *